United States Patent
Inada et al.

[11] Patent Number: 5,965,269
[45] Date of Patent: Oct. 12, 1999

[54] ADHESIVE, ADHESIVE FILM AND ADHESIVE-BACKED METAL FOIL

[75] Inventors: Teiichi Inada, Shimodate; Kazunori Yamamoto; Yasushi Shimada, both of Tsukuba; Yasushi Kumashiro, Shimodate, all of Japan

[73] Assignee: Hitachi Chemical Company, Ltd., Tokyo, Japan

[21] Appl. No.: 08/930,512

[22] PCT Filed: Mar. 27, 1996

[86] PCT No.: PCT/JP96/00798

§ 371 Date: Oct. 3, 1997

§ 102(e) Date: Oct. 3, 1997

[87] PCT Pub. No.: WO96/31574

PCT Pub. Date: Oct. 10, 1996

[30] Foreign Application Priority Data

Apr. 4, 1995 [JP] Japan .................................. 7-078543
Feb. 14, 1996 [JP] Japan .................................. 8-026806

[51] Int. Cl.⁶ .................................................. B32B 27/38
[52] U.S. Cl. .................. 428/413; 428/418; 525/92 B; 525/92 H; 525/112; 525/486; 525/526; 525/530; 525/930; 524/408; 524/409
[58] Field of Search .................. 428/413, 418; 525/92 B, 92 H, 112, 486, 526, 530, 930; 524/408, 409

[56] References Cited

U.S. PATENT DOCUMENTS 5,278,259 1/1994 Futakuchi et al. ...................... 525/524
5,403,869 4/1995 Arike et al. ............................. 525/524
5,461,112 10/1995 Masse et al. ......................... 525/92 B

FOREIGN PATENT DOCUMENTS

| 0129191 | 12/1984 | European Pat. Off. . |
| 0336732 | 10/1989 | European Pat. Off. . |
| 0361754 | 4/1990 | European Pat. Off. . |
| 0394965 | 10/1990 | European Pat. Off. . |
| 61-163923 | 7/1986 | Japan . |
| 63-146917 | 6/1988 | Japan . |
| 3181580 | 8/1991 | Japan . |
| 5170875 | 7/1993 | Japan . |
| 7-076679 | 3/1995 | Japan . |

*Primary Examiner*—Randy Gulakowski
*Attorney, Agent, or Firm*—Antonelli, Terry, Stout & Kraus, LLP

[57] ABSTRACT

An adhesive comprising (1) 100 parts by weight of a combination of an epoxy resin having a weight average molecular weight of less than 5,000 and a curing agent, (2) 10 to 40 parts by weight of a high-molecular weight component being compatible with the epoxy resin and having a weight average molecular weight of 30,000 or above, (3) 20 to 100 parts by weight of a high-molecular weight component being incompatible with the epoxy resin and having a weight average molecular weight of 30,000 or above, and (4) 0.1 to 5 parts by weight of a cure accelerator. The adhesive is excellent not only in moisture resistance, heat resistance, adhesive strength at high temperature, heat dissipation, reliability of insulation, crack resistance and flexibility but also in circuit filling and tight adhesion, and exhibits suitable flow properties.

26 Claims, No Drawings

ADHESIVE, ADHESIVE FILM AND ADHESIVE-BACKED METAL FOIL

TECHNICAL FIELD

The present invention relates to an insulating adhesive, an adhesive film and an adhesive-backed metal foil, which are useful for printed wiring boards.

BACKGROUND ART

Recent advancement of electronic instruments has been accompanied by increasingly strict requirements of wiring boards for packaging semiconductor (hereinafter, will be referred to as semiconductor-packaging wiring boards), such as PGA (pin grid array) or BGA (ball grid array) packages, for high wiring density, moisture resistance and heat resistance. Also, the heat generated per unit area has been increased due to increasing electronic component mounting density and increasing integration of semiconductor devices, requiring efficient heat dissipation from the semiconductor-packaging wiring boards. Common means for accelerating the dissipation of heat generated by electronic components mounted on semiconductor-packaging wiring boards are the use of wiring boards which are composed of a metal plate bonded with copper foil by insulating adhesives, or printed wiring boards bonded to radiation plates of high heat conductivity, such as aluminum plates, copper plates or steel plates.

To meet these requirements, these wiring boards require complicated shape-processing, such as multilayering, formation of cavities or installation of radiation plates.

Bonding materials commonly used to produce semiconductor-packaging multilayer wiring boards or to bond radiation plates are glass cloth-epoxy resin prepregs containing glass fibers base materials, and rubber-epoxy resin adhesives. When radiation plates are bonded with semiconductor-packaging wiring boards by using glass cloth-epoxy resin prepregs, the wiring boards tend to warp or form CAF (Conductive Anodic Filaments), which occur due to migration of copper ion along the interface between glass fibers and resin, and, on moisture absorption, become poor in soldering heat resistance and electrolytic corrosion resistance. Further, the use of glass cloth-epoxy resin prepregs in the production of wiring boards requiring complicated shape-processing, such as formation of cavities or installation of radiation plates, causes the disadvantage that epoxy resin powder is scattered during drilling to coat connecting surfaces, causing connecting error in wire bonding, or the resin flows in large quantities and even into cavities by the heat and pressure applied during lamination, so that the cavities lose necessary spaces.

Rubber-epoxy resin adhesives are mixtures of epoxy resins with various rubbers components, such as acrylic rubbers or acrylonitrile-butadiene rubbers, which are added to improve the adhesives in strength, flexibility and adhesion. Because of their relative excellency in properties, such as electrical properties, heat resistance and solvent resistance, these conventional acrylic rubber-containing adhesives have been used in the production of flexible boards.

Typical examples of acrylic rubber-containing adhesives are adhesive sheets made of mixtures of acrylic rubber with thermosetting resins, such as epoxy resins, which, however, exhibit insufficient properties at high temperatures due to the low epoxy resin content of about 30% by weight. Further, these adhesives composed mainly of acrylic rubbers have the defects that though the loss of adhesion strength after a long term treatment at high temperatures is relatively small, the adhesion strength at high temperatures is poor, and that the properties, such as heat resistance and electric properties, are considerably deteriorated on moisture absorption. Adhesives composed mainly of acrylonitrile-butadiene rubbers have the defect that the loss of adhesion strength after a long term treatment at high temperatures is considerable and they are inferior in electrical corrosion resistance. The deterioration is particularly significant when they are subjected to tests for moisture resistance under today's severe conditions to which electronic instruments are exposed, such as PCT (pressure cooker test) treatments.

As adhesives improved in the soldering resistance after moisture absorption, in Japanese Patent Application Unexamined Publication No. 60-243180 (1985) are disclosed adhesives containing acrylic resins, epoxy resins, polyisocyanates and inorganic fillers, in Japanese Patent Application Unexamined Publication No. 61-138680 are disclosed adhesives containing acrylic resins, epoxy resins, compounds having urethane bonds in molecule and primary amines at both ends. These adhesives, however, are unsatisfactory since they are considerably deteriorated when subjected to tests for moisture resistance under today's severe conditions to which electronic instruments are exposed, such as PCT.

Rubber-epoxy resin adhesives improved in adhesion at high temperatures are mixtures of reactive rubber components, such as reactive acrylic rubbers or reactive acrylonitrile-butadiene rubbers, with epoxy resins. Examples of such reactive rubber-epoxy resin adhesives are adhesive compositions disclosed in Japanese Patent Application Unexamined Publication No. 3-181580 (1991), which comprise acrylic rubbers having carboxylic groups, hydroxyl groups or epoxy groups, alkyl phenols, epoxy resins and imidazolium trimellitate as an cure accelerator, and are used to bond base film of flexible printed wiring boards with copper foil. In these adhesive compositions, the carboxyl group-containing acrylic rubbers, the hydroxyl group-containing acrylic rubbers and the epoxy group-containing acrylic rubbers are used individually, and compositions containing two or more of them are not disclosed.

As adhesive compositions improved in adhesion to shiny side of copper foil and in heat resistance, in Japanese Patent Application Unexamined Publication No. 7-76679 (1995) are disclosed adhesive compositions which are used in sheet heaters having resistance circuits and comprise 60 to 80 parts by weight of epoxy group-containing acrylic rubbers, 8 to 20 parts by weight of alkyl phenols, 8 to 20 parts by weight of epoxy resins and 0.2 to 1.0 parts by weight of imidazole curing agents, and in Japanese Patent Application Unexamined Publication No. 7-173449 (1995) are disclosed epoxy group-containing acrylic rubber adhesive compositions composed mainly of epoxy group-containing acrylic rubbers.

The above adhesives disclosed in Japanese Patent Application Unexamined Publication Nos. 3-181580, 7-76679 and 7-173449 are not applicable for semiconductor-packaging wiring boards, such as PGA or BGA packages, because they are insufficient in moisture resistance, heat resistance and adhesion strength at high temperatures and, in a moistened state, considerably deteriorated in properties, particularly when subjected to moisture resistance tests under severe conditions, such as PCT treatments.

Additionally, these adhesives need a large ratio of high-molecular weight components contributing flexibility because as the ratio of low-molecular weight components, such as epoxy resins, increases, the degree of cross-linking increases and lowers the flexibility of film made therefrom. The increase of the ratio of the high-molecular weight components, however, inevitably decreases the ratio of the low-molecular weight components having good flowability, to decrease the flowability of the adhesives. These adhesives, even with a low flowability, are applicable without practical troubles in flexible wiring boards, but when used for producing semiconductor-packaging wiring boards, such as PGA or BGA packages, they cannot contribute properties enough for practical uses. That is, the requirements of semiconductor package-mounting wiring boards for flatness of board surfaces, circuit filling and adhesion of adhesives with board surfaces bearing blackened or etched copper foil are too strict for these conventional adhesives of poor flowability to satisfy any one of the requirements for flatness, circuit filling and adhesion.

Further, with the recent increases of the integration and wiring density in IC in PGA and BGA packages, which are more significant than in common wiring boards, heat management has become very important, but there have been no adhesive films designed for heat dissipation.

Among conventional adhesives which are mixtures of acrylic rubber and epoxy resin, those with the greater ratio of acrylic rubbers are defective in moisture resistance, and are revealed to be deteriorated in properties particularly by a PCT moistening treatment at 121° C. due to their low cross-linking density. Adhesive sheets formed from those with the greater ratio of epoxy resins are fragile and tacky due to low strength, low flexibility and high tackiness, and are difficult to handle. Another problem is such a poor cracking resistance that they crack on curing.

In the methods of producing semiconductor-packaging wiring boards, such as PGA or BGA packages, wherein lamination is carried out after adhesive sheets cured to B-stage are drilled to form cavities or IVH (Interstitial Via Hall), it is necessary to reduce the outflow of resins from the drilled edges at the time of lamination with heat and pressure. The resins, however, need some flowability to bury the circuits formed in the wiring boards without leaving voids. Conventional adhesives become more flowable on lamination as the epoxy resin content increases, and cause the troubles of exudation into cavities or IVH, interlaminar connection failure due to the adhesives which cover the circuits formed in the holes, and a decrease of interlaminar insulation distance due to the decreased thickness of insulation layers formed from the adhesives. As the acrylic rubber content increases, circuit filling properties decrease. Therefore, it has been difficult to satisfy both the requirements for the control of exudation due to flowability (control of flowability) and the circuit filling properties (improvement of flowability).

As described above, there have been provided no adhesives satisfying the moisture resistance, heat resistance, adhesive strength at high temperatures, proper flowability and circuit filling that are required of adhesives used in semiconductor-packaging wiring boards, such as PGA or BGA packages.

DISCLOSURE OF INVENTION

An object of the present invention is to provide an adhesive which satisfies the moisture resistance, heat resistance, adhesive strength at high temperature and electrolytic corrosion resistance required of adhesives to be used in multilayer printed wiring boards or semiconductor-packaging wiring boards, such as PGA or BGA packages, is well resistive particularly to tests for moisture resistance under severe conditions, such as PCT (pressure cooker test), is excellent in tight adhesion, and has a proper flowability, which gives excellent circuit filling and reconciles contribution of flowability and improvement of processability.

We found that the above problems can be solved by blending a relatively low-molecular weight epoxy resin with specific ratios of high-molecular weight component compatible with the epoxy resin and a high-molecular weight component incompatible with the epoxy resin, and have completed the present invention.

That is, the present invention provides an adhesive produced by preparing a varnish of a composition dissolved in a solvent and heating the composition to dry, the composition comprising (1) 100 parts by weight of a combination of an epoxy resin having a weight average molecular weight of less than 5,000 and a curing agent, (2) 10 to 40 parts by weight of a compatible high-molecular weight component selected from the group consisting of a phenoxy resin, a carboxyl group-containing acrylic rubber, a carboxyl group-containing acrylonitrile-butadiene rubber, each having a weight average molecular weight of 30,000 or above, a high-molecular weight epoxy resin having a weight average molecular weight of 30,000 to 80,000 and an ultra high-molecular weight epoxy resin having a weight average molecular weight of more than 80,000, (3) 20 to 100 parts by weight of an incompatible high-molecular weight component having a weight average molecular weight of 30,000 or above and being selected from the group consisting of an epoxy group-containing acrylic rubber, an epoxy group-containing acrylonitrile-butadiene rubber, an epoxy group-containing polybutylene rubber and an epoxy group-containing polybutadiene, and (4) 0.1 to 5 parts by weight of a cure accelerator.

The present invention further provides an adhesive film produced by forming a layer of the above adhesive on a base film, and an adhesive-backed metal foil produced by forming a layer of the above adhesive on a metal foil.

BEST MODE FOR CARRYING OUT THE INVENTION

The epoxy resin to be used in the present invention may be any one which exhibits adhering action on curing, particularly one being difunctional and having a weight average molecular weight of less than 5,000, preferably less than 3,000. To improve the flowability at the time of lamination, bisphenol A or bisphenol F liquid epoxy resins having a weight average molecular weight of less than 500 are particularly desirable. Examples of bisphenol A or bisphenol F liquid epoxy resins having a weight average molecular weight of less than 500 are EPIKOTE 807, EPIKOTE 827 and EPIKOTE 828 (trade names) marketed by Yuka Shell Epoxy Co., Ltd., D.E.R. 330, D.E.R. 331 and D.E.R. 361 (trade names) marketed by Dow Chemical Japan Co., Ltd., and YD 128 and YDF 170 (trade names) marketed by Tohto Kasei Co., Ltd.

To increase Tg, polyfunctional epoxy resins of trifunctionality or more, such as phenol novolac epoxy resins and cresol novolac epoxy resins, may be used as a part of the epoxy resin. When these polyfunctional epoxy resins are used, they are preferably 10 to 50% by weight based on the total of the difunctional epoxy resins and the polyfunctional epoxy resins.

Examples of phenol novolac epoxy resins are EPPN-201 (trade name) marketed by Nippon Kayaku Co., Ltd., and examples of cresol novolac epoxy resins are ESCN-001 and ESCN-195 (trade names) marketed by Sumitomo Chemical Co., Ltd. and EOCN 1012, EOCN 1025 and EOCN 1027 (trade names) marketed by Nippon Kayaku Co., Ltd.

Curing agents conventionally used as curing agents for epoxy resins may be used in the present invention as the curing agent for the epoxy resin, and examples of the curing agents are amines, polyamides, acid anhydrides, polysulfides, boron trifluoride and compounds having two or more phenolic hydroxyl groups per molecule, such as bisphenol A, bisphenol F and bisphenol S. Phenol novolac resins, bisphenol novolac resins and cresol novolac resins are particularly preferable because of their excellent electrolytic corrosion resistance on moisture absorption. These resins preferably have a weight average molecular weight of 500 to 2,000, particularly 700 to 1,400.

Examples of the above particularly preferable curing agents are PHENORITE LF 2882, PHENORITE LF 2822, PHENORITE TD-2090, PHENORITE TD-2149, PHENORITE VH4150 and PHENORITE VH4170 (trade names) marketed by Dainippon Ink & Chemicals, Inc.

The preferred amount of curing agents is such that the adhesive contains 0.8 to 1.2 moles, preferably 0.95 to 1.05 moles of groups reactive with epoxy groups per mole of epoxy groups contained in the adhesive.

Preferred cure accelerators are imidazoles. Examples of imidazoles are 2-methylimidazole, 2-ethyl-4-methylimidazole, 1-cyanoethyl-2-phenylimidazole and 1-cyanoethyl-2-10 phenylimidazolium trimellitate.

Examples of commercially available imidazoles are 2E4MZ, 2PZ-CN and 2PZ-CNS (trade names) marketed by Shikoku Kasei Kogyo Co., Ltd.

The compatible high-molecular weight component to be used in the present invention preferably has a weight average molecular weight of 30,000 to 300,000, more preferably 45,000 to 200,000, to reduce the tackiness of the adhesive cured to B-stage and to improve the flexibility after curing. High-molecular weight epoxy resins which may be used have a weight average molecular weight of 30,000 to 80,000, ultra high-molecular weight epoxy resins which may be used have a weight average molecular weight of more than 80,000, preferably 80,000 to 200,000.

Examples of phenoxy resins are PHENOTOHTO YP-40, PHENOTOHTO YP-50 and PHENOTOHTO YP-60 (trade names) marketed by Tohto Kasei Co., Ltd. High-molecular weight epoxy resins having a weight average molecular weight of 30,000 to 80,000 and ultra high-molecular weight epoxy resins having a weight average molecular weight of more than 80,000 can be produced by the methods disclosed in the specifications of U.S. Pat. Nos. 5,391,687, 5,225,268 and 5,304,399. Examples of the reactive rubber containing functional groups of high polarity are a carboxyl group-containing acrylonitrile-butadiene rubber (trade name: PNR-1) marketed by Japan Synthetic Rubber Co., Ltd. and a carboxyl group-containing acrylonitrile-butadiene rubber (trade name: NIPOL 1072M) marketed by Nippon Zeon Co., Ltd. An example of the carboxyl group-containing acrylic rubbers is HTR-860P (trade name) marketed by Teikoku Kagaku Sangyo Co., Ltd.

The amount of the compatible high-molecular weight component is 10 to 40 parts by weight, preferably 20 to 30 parts by weight, per 100 parts by weight of the total of the epoxy resin and the curing agent. If the amount of the high-molecular weight component is less than 10 parts by weight, the flexibility of the phase composed mainly of the epoxy resin (hereinafter, will be referred to as epoxy resin phase) may be insufficient, or insulation may decrease due to lowered tackiness or cracks. If it is more than 40 parts by weight, the Tg of the epoxy resin phase may decrease.

The preferred among the above various incompatible high-molecular weight components are epoxy group-containing acrylic rubbers, particularly epoxy group-containing acrylic rubbers which are copolymerization products of (a) 18 to 40% by weight of acrylonitrile, (b) 2 to 6% by weight of glycidyl acrylate or glycidyl methacrylate as a functional group-containing monomer and (c) 54 to 80% by weight of ethyl acrylate, ethyl methacrylate, butyl acrylate or butyl methacrylate, and have a glass transition temperature of $-10°$ C. or higher and a weight average molecular weight of 800,000 or above, such as HTR-860P-3 (trade name) marketed by Teikoku Kagaku Sangyo Co., Ltd. Other functional group-containing monomers, for example carboxylic acid types, such as acrylic acid, or hydroxyl group types, such as hydroxymethyl acrylate or hydroxymethyl methacrylate, are undesirable since they accelerate cross-linking, to cause gelation of varnish or to decrease the adhesive strength due to increased cure degree in B-stage state. Glycidyl acrylate and glycidyl methacrylate to be used as the functional group-containing monomers may be used individually or in combination, in a copolymerization ratio (when used in combination, the total copolymerization ratio) of 2 to 6% by weight. If the amount of glycidyl acrylate and glycidyl methacrylate is less than 2% by weight, adhesive strength may be insufficient, and if it is more than 6% by weight, gelation tends to occur. Ethyl acrylate, ethyl methacrylate, butyl acrylate and butyl methacrylate may be used individually or in combination or two or more, and the copolymerization ratio (when used in combination, the total copolymerization ratio) is 54 to 80% by weight and is selected considering the Tg of the product copolymers. If the Tg is lower than $-10°$ C., adhesive film cured to B-stage becomes too tacky to handle. Therefore, the Tg of the copolymers is $10°$ C. or higher, preferably $-10°$ C. to $30°$ C. The polymerization may be performed, for example, by pearl polymerization or emulsion polymerization.

The content of polymerized acrylonitrile in the epoxy group-containing acrylic rubbers is 18 to 40% by weight. If it is less than 18% by weight, the adhesive may become poor in solvent resistance and be attacked by solvent in following work processes, and if it is more than 40% by weight, the compatibility of the copolymers with other components may be decreased, or the copolymerization may become difficult.

The epoxy group-containing acrylic rubbers to be used have a weight average molecular weight of 800,000 or above. The reason is that those having a weight average molecular weight of 800,000 or above cause little decrease of the strength and flexibility and little increase of tackiness of adhesives in sheet or film form, and also prevent excessive increase of flowability which makes the control of resin exudation difficult. The weight average molecular weight of the epoxy group-containing acrylic rubbers is preferably 2,000,000 or lower because the flowability and circuit filling of the adhesive decrease with increasing molecular weight.

To prevent the decrease of the strength of film and the increase of tackiness, the content of the incompatible high-molecular weight component, such as the above epoxy group-containing acrylic rubbers, is at least 20 parts by weight. Also it should be 100 parts by weight or less because the rubber component phase increases and the epoxy resin phase decreases with increasing content of the incompatible high-molecular weight component, thereby decreasing reliability of insulation at high temperature, heat resistance and moisture resistance.

In addition, by the combined use of the high-molecular weight component being compatible with the epoxy resin and the high-molecular weight component being incompatible with the epoxy resin and having such a high weight average molecular weight of 30,000 or above, molecules compatible with the epoxy resin and molecules incompatible with the epoxy resin tangle each other, thereby preventing extension of cracks which may occur due to phase separation.

To improve the interfacial bonding between different materials, coupling agents may be added to the adhesive. Preferred coupling agents are silane coupling agents.

Examples of silane coupling agents are

γ-glycidoxypropyltrimethoxysilane,

γ-mercaptopropyltrimethoxysilane,

γ-aminopropyltriethoxysilane,

γ-ureidopropyltriethoxysilane and

N-β-aminoethyl-γ-aminopropyltrimethoxysilane.

These coupling agents are marketed by Japan Unicar Co., Ltd. in the trade names of NUC A-187 for γ-glycidoxypropyltrimethoxysilane, NUC A-189 for γ-mercaptopropyltrimethoxysilane, NUC A-1100 for γ-aminopropyltriethoxysilane, NUC A-1160 for γ-ureidopropyltriethoxysilane and NUC A-1120 for N-β-aminoethyl-γ-aminopropyltrimethoxysilane, and may be used suitably.

Considering effects, heat resistance and cost, the content of coupling agents is preferably 0.1 to 10 parts by weight, more preferably 0.1 to 5 parts by weight, per 100 parts by weight of the epoxy resin.

Inorganic ion-adsorbents may also be added to improve the insulation reliability on moisture absorption by adsorption of ionic impurities. Considering effects, heat resistance and cost, the content of inorganic ion-adsorbents is preferably 0.5 to 10 parts by weight, more preferably 2 to 7 parts by weight. If it exceeds 10 parts by weight, heat resistance may decrease.

Inorganic ion-adsorbents include inorganic ion-adsorbents which adsorb inorganic ions, ion exchangers which undergo ion exchange reactions and others having both functions.

Those adsorbing inorganic ions are inorganic solid matters which separate ions from liquids or solids by mass transfer using the adsorbing properties of porous solids, and include, for example, active carbon, natural and synthetic zeolites, silica gel, activated alumina and activated clay, which are excellent in heat resistance and chemical resistance.

Inorganic ion exchangers separate ions from liquids or solids by ion exchange reactions, and include, for example, synthetic aluminosilicates, such as synthetic zeolites, hydrated oxides of metals, such as antimony pentoxide hydrate, and acidic salts of polyfunctional metals, such as zirconium phosphate. Silica gel and activated clay also work as inorganic ion exchangers. Hydrotalcites are known to bind halogens and are a kind of inorganic ion exchangers.

Examples of commercially available inorganic ion-adsorbents are IXE-100 (trade name) comprising zirconium compounds, IXE-600 (trade name) comprising antimony-bismuth compounds and IXE-700 (trade name) comprising magnesium-aluminum compounds, all marketed by Toagosei Chemical Co., Ltd. An example of commercially available hydrotalcites is DHT-4A (trade name) marketed by Kyowa Kagaku Kogyo Co., Ltd.

To prevent elution of ionized copper, compounds known as anti-copper damage agents, such as triazinethiol compounds and bisphenol reductants, may also be added. Examples of bisphenol reductants are 2,2'-methylene-bis(4-methyl-6-tert-butylphenol) and 4,4'-thio-bis(3-methyl-6-tert-butylphenol).

An anti-copper damage agent comprising triazinethiol compounds is marketed by Sankyo Seiyaku Co., Ltd. in the trade name of GISNET DB. An anti-copper damage agent comprising bisphenol reductants is marketed by Yoshitomi Seiyaku Co., Ltd. in the trade name of YOSHINOX BB.

To obtain adhesives which are improved in thermal conductivity or surface hardness, or are endowed with non-flammability or thixotropy or have an adjusted melt viscosity, inorganic fillers may also be added. The preferred content of inorganic fillers in the adhesive is 13 to 38% by volume, preferably 15 to 30% by volume. If it is less than 13% by volume, the effects made by the addition of inorganic fillers may be insufficient, and if it is more than 38% by volume, the adhesive may have a lowered flexibility, a lowered adhesion and a electric strength lowered by remaining voids.

Examples of inorganic fillers are aluminum hydroxide, magnesium hydroxide, calcium carbonate, magnesium carbonate, calcium silicate, magnesium silicate, calcium oxide, magnesium oxide, alumina powder, aluminum nitride powder, aluminum borate whisker, boron nitride powder, silica, such as crystalline silica and amorphous silica.

To improve thermal conductivity, alumina, aluminum nitride, boron nitride and silica, such as crystalline silica or amorphous silica, are desirable.

Among these, alumina owes its desirability to its excellence in heat dissipation, heat resistance and insulation. Crystalline silica and amorphous silica are inferior to alumina in heat dissipation, but owe their desirability to their low content of ionic impurities whereby they exhibit excellent insulation when subjected to PCT treatments, and hardly cause corrosion of copper foil, aluminum wire and aluminum plates.

To endow non-flammability, aluminum hydroxide and magnesium hydroxide are desirable.

To adjust melt viscosity or to endow thixotropy, aluminum hydroxide, magnesium hydroxide, calcium carbonate, magnesium carbonate, calcium silicate, magnesium silicate, calcium oxide, magnesium oxide, alumina, crystalline silica and amorphous silica are desirable.

To increase surface hardness, alumna short fiber and aluminum borate whisker are desirable.

The adhesive film of the present invention can be produced by coating a base film with a varnish containing the components of the adhesive dissolved or dispersed in a solvent, removing the solvent by heating, to form an adhesive layer on the base film. Base films which may be used are plastic films, such as polytetrafluoroethylene films, polyethyleneterephthalate films, release-treated polyethyleneterephthalate films, polyethylene films, polypropylene films, polymethylpentene films and polyimide films. The base film may be peeled off before application to apply only the adhesive layer, or may be removed after applied together with the adhesive layer.

Examples of commercially available plastic films which may be used in the present invention are KAPTON (trade name, produced by Toray Du Pont Co., Ltd.) and APICAL (trade name, produced by Kanegafuchi Chemical Industry Co., Ltd.) which are polyimide films, and LUMILAR (trade name, produced by Toray. Du Pont Co., Ltd.) and PULEX (trade name, produced by Teijin Ltd.) which are polyethyleneterephthalate films.

The adhesive of the present invention may also be applied to metal foil, such as copper foil or aluminum foil, as an alternative base film, to form an adhesive-backed metal foil, or may be printed or applied on aluminum plates, copper plates or steel plates by screen printing or application.

Metal foils which may be used in the adhesive-backed metal foil of the present invention are foils of metals or alloys, for example, copper foil, aluminum foil or stainless steel foil, with copper foil particularly preferred. These foils preferably have roughened surfaces, such as mat surfaces.

The adhesive of the present invention may also be used as resist by printing it on predetermined areas of circuit-patterned surfaces of printed wiring boards.

Solvents which are suitable for the preparation of the varnish of the adhesive of the present invention are solvents having a relatively low boiling point, such as methyl ethyl ketone, acetone, methyl isobutyl ketone, 2-ethyoxyethanol, toluene, butyl cellosolve, methanol, ethanol and 2-methoxyethanol. Solvents having high boiling points may be added to improve coating quality. Examples of solvents having high boiling points are dimethylacetamide, dimethylformamide, methylpyrrolidone and cyclohexanone.

The varnish is prepared preferably by kneading using, for example, a mixing and drilling machine, three rolls or beads mill, or a combination of two or more. Also the mixing time can be reduced by adding high-molecular weight matters after fillers are mixed with low molecular weight matters. The varnish thus prepared is preferably vacuum-degasified to remove the bubbles incorporated in the varnish.

The adhesive film and adhesive-backed metal foil of the present invention, in general, are produced by applying the adhesive varnish on base films, such as the above-described plastic films or metal foils, followed by removal of solvents by drying with heat, and the drying with heat is preferably carried out until the dried adhesive has generated a heat of 10 to 40% of a total calorific value which is generated by a complete curing of the adhesive and measured by DSC (differential scanning calorimetry). During the heating for removing solvents, the curing and gelation of the adhesive composition proceed. Since the degree of cure affects the flowability of the adhesive, it is controlled to adjust the exudation and circuit filling of the adhesive appropriately. DSC is based on the principle of the null method wherein heat is added or taken away to always cancel the temperature difference between a sample from a standard material which does not cause exotherm or endotherm within the range of measuring temperature, and may be performed by using commercially available measuring apparatuses. The reaction of the resin compositions is an exothermic reaction, and when a sample is heated at a uniform rate of heating, the sample reacts to generate heat. From a chart of the generated heat made by DSC, the calorific value generated by the sample, namely the area which is surrounded by the exotherm curve and the base line of the standard material, is obtained. The measurement of the calorific value is carried out by increasing the temperature from room temperature to 250° C. at a rate of heating of 5 to 10° C./min. This measurement can be performed easily by using DSC analyzers by which these procedures are performed automatically. The heat generated by an adhesive during the drying following to the application to the above base film or metal foil is obtained as follows. First solvents are dried away at 20° C. with a vacuum dryer to obtain a sample which is not yet cured. The total calorific value A (J/g) generated by the sample is then measured. Subsequently, the calorific value B of another sample which has been dried after application is measured. The degree of cure C (%) of the latter sample, which has generated some heat by the drying after the application, is obtained using the following equation.

$$C(\%) = (A-B) \times 100/A$$

The epoxy resin base adhesive of the present invention is characterized in that the epoxy resin occupies a large portion of the total of the epoxy resin and the incompatible high-molecular weight component, such as an epoxy group-containing acrylic rubber. Since cured epoxy resins have relatively high Tg and good moisture resistance, the increase in the ratio of epoxy resins improves moisture resistance and heat resistance. The problems of handling, such as the decreases of film strength and flexibility and the increase of tackiness, which have been inevitable for conventional adhesive sheets, are solved by the following methods.

1) Moisture resistance is improved by using the epoxy resin as the main component.

2) The film strength and flexibility of the adhesive film are ensured by adding, even in a small amount, the incompatible high-molecular weight component being incompatible with the epoxy resin and having a great molecular weight, particularly an epoxy group-containing acrylic rubber.

3) Tackiness is reduced by adding the compatible high-molecular weight component and having a weight average molecular weight of 30,000 or above.

4) Particularly, the epoxy group-containing acrylic rubber described above endows the adhesive with electric strength and electrolytic corrosion resistance.

5) By adding inorganic fillers, tackiness can be further reduced and cracking resistance can be further improved.

The problems of flowability and circuit filling, which accompany the increase of the epoxy resin content, are solved as follows by using the above-described epoxy group-containing acrylic rubber as the high-molecular weight component being incompatible with the epoxy resin.

In this invention, the epoxy resin and the compatible high-molecular weight component form a uniform phase, and by using the epoxy group-containing acrylic rubber as the incompatible high-molecular weight component, the epoxy groups contained in the epoxy group-containing acrylic rubber partially react with them by the drying with heat, to cause overall cross-linking and gelation, with some of the epoxy resin remaining unreacted. This controls the flowability so that the adhesive with a large epoxy resin content has reduced flowability. In spite of the overall gelation, the large amount of unreacted epoxy resin remaining in the gel exudes from the gel on pressing, to prevent decreases of adhesion and circuit filling.

When the adhesive is dried, both the epoxy groups contained in the epoxy group-containing acrylic rubber and the epoxy resin react, but the epoxy group-containing acrylic rubber having a high molecular weight and many epoxy groups per molecule chain sets to gel even if the reaction proceeds only a little. Generally, the gelation occurs when a heat of 10 to 40% of the total calorific value as measured by DSC which will be generated by complete cure has been generated, that is in A-stage or in the first half of B-stage. Therefore, the adhesive sets to gel with a large amount of unreacted ingredients, such as unreacted epoxy resin, contained therein, and has a low flowability due to its drastically increased melt viscosity as compared that measured before gelation. Since the unreacted ingredients exude from the gel on pressing, even the adhesive which has been set to gel is hardly deteriorated in adhesion and circuit filling. Further, there is another advantage that since the adhesive can be formed into film with a large amount of unreacted ingredients, such as the epoxy resin, contained therein, the life (the period of applicability) of adhesive film and adhesive-backed metal foil is increased.

Conventional adhesives leave only a little amount of unreacted ingredients, such as epoxy resins, after gelation, since gelation does not occur until the latter half of B-stage or C-stage. They, therefore, have low flowability and exhibit low adhesion and poor circuit filling since only a little amount of unreacted ingredients can exude from the gel on pressing.

Though the relationship between the reactivity of the epoxy groups contained in the epoxy group-containing acrylic rubbers and the reactivity of the epoxy groups of the low-molecular weight epoxy resins is not clear, at least the same degree as that of the latter is sufficient for the former, and it is not necessary that only the epoxy groups contained in the epoxy group-containing acrylic rubbers selectively react.

Herein, A-, B- and C-stages indicate the degree of cure of adhesives. Adhesives in A-stage has been cured little and not yet set to gel, and has generated 0 to 20% of the total calorific value, as measured by DSC, which will be generated by complete cure. Adhesives in B-stage has been cured and set to gel to some degree, and has generated 20 to 60% of the total calorific value, as measured by DSC, which will be generated by complete cure. Adhesives in C-stage has been fairly cured and has set to gel, and has generated 60% to 100% of the total calorific value, as measured by DSC, which will be generated by complete cure.

As to the judgment of gelation, those which are not dissolved completely but swollen after dipped in a solvent having a high permeability, such as THF (tetrahydrofuran), at 25° C. for 20 hours are judged to have set to gel. The experiment for this judgment was carried out as follows.

After an adhesive (weight W1) is dipped in THF and allowed to stand therein at 25° C. for 20 hours, the solid remaining not dissolved was filtered on a nylon cloth of 200 mesh and weighed after drying (weight W2). The THF-extraction percentage (%) is calculated from the following equation. When the THF-extraction is more than 80% by weight, the adhesive is judged not yet set to gel, and when it 80% by weight or less, the adhesive is judged to have set to gel.

$$\text{THF-extraction percentage} \atop (\% \text{ by weight}) = \frac{(\text{weight } W1 - \text{weight } W2) \times 100}{\text{weight } W1}$$

According to the present invention, the above effects may further be improved by increasing the melt viscosity and endowing thixotropy by addition of inorganic fillers.

According to the present invention, in addition to the above effects, the adhesive of the present invention can be improved in heat dissipation and endowed with non-flammability, a proper viscosity at bonding temperature and improved surface hardness.

Hereinafter, the present invention will be described in detail referring to Examples.

EXAMPLES 1–18 AND COMPARATIVE EXAMPLES 1–10

Example 1

To a composition consisting of 30 parts by weight of a bisphenol A epoxy resin (weight average molecular weight: 400, epoxy group equivalent: 200, produced by Yuka Shell Epoxy Co., Ltd., trade name: EPIKOTE 828), 25 parts by weight of a bisphenol A novolac resin (weight average molecular weight: 960, phenolic hydroxyl group equivalent: 120, produced by Dainippon Ink & Chemicals, Inc., trade name: PHENORITE LF2882), 30 parts by weight of a phenoxy resin (weight average molecular weight: 50,000, produced by Tohto Kasei Co., Ltd., trade name: PHENO-TOHTO YP-50), 30 parts by weight of an epoxy group-containing acrylic rubber (weight average molecular weight: 1,000,000, epoxy group equivalent: 3,100, produced by Teikoku Kagaku Sangyo Co., Ltd., trade name: HTR-860P-3) as a high-molecular weight component incompatible with the epoxy resin, 0.5 parts by weight of 1-cyanoethyl-2-phenylimidazole (produced by Shikoku Kasei Kogyo Co., Ltd., trade name: 2PZ-CN) as a cure accelerator, 0.5 parts by weight of γ-glycidoxypropyltrimethoxysilane (produced by Nippon Unicar Co., Ltd., trade name: NUC A-187) as a coupling agent and 2 parts by weight of an antimony-bismuth compound (produced by Toagosei Kagaku Kogyo Co., Ltd., trade name: IXE600) as an inorganic ion-adsorbent, was added 150 parts by weight of methyl ethyl ketone, and mixed with a beads mill. After the viscosity was adjusted by adding 30 parts by weight of methyl ethyl ketone, the mixture was vacuum-degasified.

The obtained varnish was applied to a release-treated polyethyleneterephthalate film of 70 μm thick, heated at 110° C. for 15 minutes to dry, to give an insulation adhesive film which was a coating of 80° μm thick being in B-stage.

Example 2

An insulation adhesive film was produced in the same manner as in Example 1, except that the phenoxy resin was replaced by the same amount of a carboxyl group-containing acrylonitrile-butadiene rubber (weight average molecular weight: 400,000, produced by Japan Synthetic Rubber, Co., Ltd., trade name: PNR-1).

Example 3

An insulation adhesive film was produced in the same manner as in Example 1, except that the amount of the phenoxy resin was reduced to 20 parts by weight, 20 parts by weight of the same carboxyl group-containing acrylonitrile-butadiene rubber as used in Example 2 was added, and the epoxy resin-containing acrylic rubber was replaced by 40 parts by weight of a non-modified acrylic rubber (produced by Teikoku Kagaku Sangyo Co., Ltd., trade name: HTR-860).

Example 4

An insulation adhesive film was produced in the same manner as in Example 1, except that the inorganic ion-adsorbent was not used.

Comparative Example 1

An insulation adhesive film was produced in the same manner as in Example 1, except that the phenoxy resin was not used.

Comparative Example 2

An insulation adhesive film was produced in the same manner as in Example 1, except that the epoxy group-containing acrylic rubber was not used.

Comparative Example 3

An insulation adhesive film was produced in the same manner as in Example 1, except that the amounts of the phenoxy resin and the epoxy group-containing acrylic rubber were increased to 80 parts by weight, respectively.

The insulation adhesive films produced in Examples 1–4 and Comparative Examples 1–3 were examined for the flexibility and cracking resistance of cured products.

Also, by using each insulation adhesive film, a copper foil of 35 μm thick and 50 millimeter square was bonded with an aluminum plate of 2 mm thick and 50 millimeter square by heating and pressing for 30 minutes at 170° C. and at a pressure of 1.96 MPa. The copper foil was then etched, leaving a central, circular portion of 20 mm diameter not etched. The electric strength between the copper foil and the aluminum plate was then measured. These results are shown in Table 1.

The testing methods are as follows.

Flexibility: Each film was wound around a cylinder of 10 mm diameter at 25° C. and was then examined for the presence of cracks.

Cracking resistance: A steel ball of 20 mm diameter was dropped from a level 200 mm high down to each insulation adhesive film placed on an aluminum plate (1.5 mm$^t$), and then the presence of cracks in the film was investigated.

Electric strength: A test piece, which had been placed for 96 hours in a pressure cooker adjusted to a temperature of 121° C., a humidity of 100% and a pressure of 2026 hPa, and another test piece, which had not been subjected to the PCT, were dipped in an insulation oil respectively, and alternating-current voltages were then applied between the copper foil and the aluminum plate at room temperature to measure the voltage which caused dielectric breakdown. The unit of the electric strength is kV.

TABLE 1

|  | Examples | | | | Comparative examples | | |
|---|---|---|---|---|---|---|---|
|  | 1 | 2 | 3 | 4 | 1 | 2 | 3 |
| Electric strength (before PCT) | 7.5 | 7.3 | 7.2 | 7.2 | 4.5 | 7.3 | 3.2 |
| Electric strength (after PCT) | 6.2 | 5.9 | 6.1 | 2.5 | 1.3 | 6.0 | 1.0 |
| Cracking resistance | good | good | good | good | good | poor | good |
| Flexibility | good | good | good | good | good | poor | good |

All the adhesive compositions prepared in Examples 1–4 contained an epoxy resin and a curing agent therefor, a high-molecular weight component compatible with the epoxy resin and a high-molecular weight component incompatible with the epoxy resin. It is shown that because of their structures consisting of a phase containing an epoxy resin and a compatible high-molecular weight component and a phase containing an incompatible high-molecular weight component, they were significantly improved in cracking resistance as compared to the one consisting of a uniform phase (Comparative Example 2).

The resin composition of Comparative Example 1 had a low electric strength due to the absence of a high-molecular weight component compatible with the epoxy resin. That of Comparative Example 2 exhibited poor cracking resistance due to the absence of a high-molecular weight component incompatible with the epoxy resin. That of Comparative Example 3 containing large amounts of high-molecular weight components was so poor in flowability as to form voids, which decreased the electric strength.

It is also shown that the adhesives of Examples 1–3 containing an inorganic ion-adsorbent had higher electric strength after moisture absorption, as compared with that of Example 4 containing no agents for capturing ions.

Examples 5–8 and Comparative Examples 4–6

Each of the compositions prepared in Examples 1–4 and Comparative Examples 1–3 was mixed with alumina powder in a ratio of 70% by volume of the composition and 30% by volume of the alumina powder, and the mixture was formed into an insulation adhesive film in the same manner as above.

The obtained insulation adhesive films were examined for the flexibility and cracking resistance of cured products. The electric strength between copper foil and aluminum plate was also measured in the same manner as in Examples 1–4 and Comparative Examples 1–3. The results were the same as those of Examples 1–4 and Comparative Examples 1–3, respectively.

Subsequently, by using each insulation adhesive film, a copper foil of 35 μm thick and 30 mm square and an aluminum plate of 2 mm thick and 30 mm square were bonded by heating and pressing for 30 minutes at a temperature of 170° C. at a pressure of 1.96 MPa. The copper foil was then etched, leaving a central, rectangular portion of 10 mm× 14 mm not etched.

After a transistor (2SC2233) was soldered to the copper foil of the test piece, the test piece was placed on a heat dissipation block, with the aluminum plate in contact with the dissipation plate, and an electric current was then applied to the transistor. The temperature (T1) of the transistor and the temperature (T2) of the heat dissipation block were measured, and the thermal resistance (X) was calculated from the measured values and the applied power (W) using the following equation 1. The results are shown in Table 2.

$$X = (T1 - T2)/W \qquad (1)$$

TABLE 2

|  | Example Nos. | | | | | Comparative Ex. Nos. | | |
|---|---|---|---|---|---|---|---|---|
|  | 1 | 5 | 6 | 7 | 8 | 4 | 5 | 6 |
| Composition to which alumina powder was added | Not added | Ex. 1 | Ex. 2 | Ex. 3 | Ex. 4 | Comp. Ex. 1 | Comp. Ex. 2 | Comp. Ex. 3 |
| Thermal resistance (° C./W) | 15 | 0.4 | 0.4 | 0.4 | 0.4 | 0.4 | 0.4 | 0.45 |

Table 2 shows that the thermal resistance, which indicates heat dissipation properties, was decreased by adding a high efficiency heat-dissipation filler.

Example 9

To a composition consisting of 30 parts by weight of a bisphenol A epoxy resin (weight average molecular weight: 400, epoxy group equivalent: 200, produced by Yuka Shell Epoxy Co., Ltd., trade name: EPIKOTE 828) and 10 parts by weight of a cresol novolac epoxy resin (weight average molecular weight: 1,000, epoxy group equivalent: 220, produced by Sumitomo Chemical Co., Ltd., trade name:

ESCN001) as epoxy resins, 25 parts by weight of a phenol novolac resin (weight average molecular weight: 960, phenolic hydroxyl group equivalent: 120, produced by Dainippon Ink & Chemicals, Inc., trade name: PHENORITE LF2882) as a curing agent for the epoxy resins, 10 parts by weight of a phenoxy resin (weight average molecular weight: 50,000, produced by Tohto Kasei Co., Ltd., trade name: PHENOTOHTO YP-50) as a high-molecular weight component being compatible with the epoxy resins and having a weight average molecular weight of 30,000 or above, 30 parts by weight of an epoxy group-containing acrylic rubber (weight average molecular weight: 1,000,000, epoxy group equivalent: 3,100, produced by Teikoku Kagaku Sangyo Co., Ltd., trade name: HTR-860P-3) as a high-molecular weight component incompatible with the epoxy resins, 0.5 parts by weight of 1-cyanoethyl-2-phenylimidazole (produced by Shikoku Kasei Kogyo Co., Ltd., trade name: 2PZ-CN) as a cure accelerator and 0.5 parts by weight of γ-glycidoxypropyltrimethoxysilane (produced by Nippon Unicar Co., Ltd., trade name: NUC A-187), was added 150 parts by weight of methyl ethyl ketone, and mixed with a beads mill. After the viscosity was adjusted by adding 30 parts by weight of methyl ethyl ketone (resinous solid content: 40% by weight), the mixture was vacuum-degasified. The obtained varnish was applied on a release-treated polyethyleneterephthalate film of 75 μm thick, heated at 110° C. for 15 minutes to dry, to give an insulation adhesive film which was a coating of 80 μm thick being in B-stage.

The degree of cure of the adhesive in this stage as measured (the rate of heating: 10° C./min) using a DSC (912-type DSC, produced by E. I. Du Pont de Nemours and Company) was such that the adhesive had generated a heat of 15% of the total calorific value generated by complete cure of the adhesive. After the adhesive (weight W1) was dipped in THF for 20 hours at 250° C., the solid remaining not dissolved was filtered on a nylon cloth of 200 mesh and weighed after drying (weight W2). The THF-extraction percentage (=(W1−W2)×100/W1) was 35% by weight.

Example 10

An adhesive film was produced in the same manner as in Example 9, except that the phenoxy resin used in Example 9 was replaced by the same amount of a carboxyl group-containing acrylonitrile-butadiene rubber (weight average molecular weight: 400,000, produced by Nippon Synthetic Rubber, Co., Ltd., trade name: PNR-1). The degree of cure of the adhesive in this stage as measured using a DSC was such that the adhesive had generated a heat of 20% of the total calorific value generated by complete cure of the adhesive. The THF-extraction percentage was 35% by weight.

Example 11

An adhesive film was produced in the same manner as in Example 9, except that the amount of the epoxy group-containing acrylic rubber used in Example 9 was changed to 50 parts by weight. The degree of cure of the adhesive in this stage as measured using a DSC was such that the adhesive had generated a heat of 20% of the total calorific value generated by complete cure of the adhesive. The THF-extraction percentage was 35% by weight.

Comparative Example 7

An adhesive film was produced in the same manner as in Example 9, except that the epoxy group-containing acrylic rubber used in Example 1 was replaced by a non-modified acrylic rubber (produced by Teikoku Kagaku Sangyo Co., Ltd., trade name: HTR-860). The degree of cure of the adhesive in this stage as measured using a DSC was such that the adhesive had generated a heat of 20% of the total calorific value generated by complete cure of the adhesive. The THF-extraction percentage was 90% by weight.

Comparative Example 8

An adhesive film was produced in the same manner as in Example 9, except that the epoxy group-containing acrylic rubber used in Example 9 was not used. The degree of cure of the adhesive in this stage as measured using a DSC was such that the adhesive had generated a heat of 20% of the total calorific value generated by complete cure of the adhesive. The THF-extraction percentage was 90% by weight.

Comparative Example 9

An adhesive film was produced in the same manner as in Example 9, except that the amount of the epoxy group-containing acrylic rubber used in Example 9 was increased to 80 parts by weight. The degree of cure of the adhesive in this stage as measured using a DSC was such that the adhesive had generated a heat of 15% of the total calorific value generated by complete cure of the adhesive. The THF-extraction percentage was 25% by weight.

The adhesive films produced in Examples 9–11 and Comparative Examples 7–9 were examined for the flexibility and cracking resistance of cured products.

After the base films were peeled off, each adhesive film was disposed between a copper foil of 35 μm thick and 50 mm× 50 mm and an aluminum plate of 2 mm thick and 50 mm× 50 mm, and then bonding was performed by heating and pressing for 30 minutes at a temperature of 170° C. and at a pressure of 1.96 MPa. The copper foil was then etched, leaving a central, circular portion of 20 mm diameter not etched. Subsequently, the electric strength between the copper foil and the aluminum plate was measured. The results are shown in Table 3.

The testing methods are as follows.

Flexibility, cracking resistance: Each adhesive film was wound around a cylinder of 10 mm diameter at 25° C. and was then examined for the presence of cracks.

Electric strength: Test pieces, which had been placed for 96 hours in a pressure cooker adjusted to a temperature of 121° C., a relative humidity of 100% and a pressure of 2026 hPa, and test pieces, which had not been subjected to the PCT, were dipped in an insulation oil respectively, and alternating-current voltages were then applied between the copper foil and the aluminum plate at room temperature to measure the voltage which caused dielectric breakdown. The unit of the electric strength is kV.

Tight adhesion: Test pieces, which had been treated in a pressure cooker (PCT) for 96 hours at a temperature of 121° C., at a relative humidity of 100%, at a pressure of 2026 hPa, test pieces, which had not subjected to the PCT, were observed. Those wherein no delamination was observed were rated as "good", and those wherein delamination was observed were rated as "poor".

The amount of exudation: After the base films were peeled off form adhesive films of 100 mm× 100 mm, a hole of 6 mm diameter was made in the adhesive layers, each of which was then disposed between the release surface of a release-treated polyethyleneterephthalate film of 75 μm thick and an aluminum plate of 2 mm thick and 100 mm× 100 mm, and bonded by heating and pressing for 30 minutes at a temperature of 170° C. at a pressure of 1.96 MPa. Subsequently, the release-treated polyethyleneterephthalate film was peeled of to measure the radial length of the resins exuded from the hole. The radial length was used to indicate the amount of exudation. An amount of exudation of not more than 1.5 mm was rated as "good", and that of larger value was rated as "bad".

Circuit filling: After the copper foils of an glass cloth base epoxy resin both-sided copper-clad laminate (the thickness of the base material: 200 μm, thickness of each copper foil: 35 μm) were patterned (pattern width: 0.5 mm, pattern gap: 0.5 mm), a film obtained by peeling off the base film from each adhesive film of 100 mm× 100 mm and an aluminum plate of 2 mm thick and 100 mm× 100 mm were superposed, respectively, on the patterned sides, and bonded by heating and pressing for 30 minutes at a temperature of 170° C. at a pressure of 1.96 MPa. A section was observed with an optical microscope, and those wherein adhesives tightly adhered to the sides of copper circuits of the patterned glass cloth base epoxy both-sided copper-clad laminate and filled the circuits without leaving voids were rated as "good", and those wherein voids were observed were rated as "poor".

Processability: The adhesive films were punched, and those which were cracked or scattered resin scraps or powder were rated as "poor", and those free of these phenomena were rated as "good".

molecular weight component incompatible with the epoxy resin, those of Examples 9–11 containing an epoxy group-containing acrylic rubber as the high-molecular weight component incompatible with the epoxy resins were superior in electric strength and tight adhesion.

The adhesive of Comparative Example 8 had poor flexibility due to the absence of the high-molecular weight component incompatible with the epoxy resins. The adhesive of Comparative Example 9 was inferior in flowability and circuit filling due to the excessive amount of the high-molecular weight component incompatible with the epoxy resins. It also had a low electric strength after the PCT treatment.

Examples 12–14 and Comparative Examples 10–12

Each of the adhesives prepared in Examples 9–11 and Comparative Examples 7–9 was mixed with alumina powder (average particle size: 0.5 μm, produced by Showa Denko Co., Ltd., trade name: AL-16OSG-1) in a ratio of 80% by volume (100 parts by volume) of the adhesive (solids including resins) and 20% by volume (25 parts by volume) of the alumina powder, and an adhesive film was produced by using the mixture in the same manner as in Example 9.

Example 15

The adhesive prepared in Example 9 was mixed with silica powder (average particle size: 5–6 μm, produced by

TABLE 3

|  |  | Example Nos. | | | Comparative Example Nos. | | |
| --- | --- | --- | --- | --- | --- | --- | --- |
|  |  | 9 | 10 | 11 | 7 | 8 | 9 |
| Epoxy resin | EPIKOTE 828 | 30 | 30 | 30 | 30 | 30 | 30 |
|  | ESCN-001 | 10 | 10 | 10 | 10 | 10 | 10 |
| Curing agent | PHENORITE LF2882 | 25 | 25 | 25 | 25 | 25 | 25 |
| Compatible high-molecular | YP-50 | 10 | 0 | 10 | 10 | 10 | 10 |
| weight component | PNR-1 | 0 | 10 | 0 | 0 | 0 | 0 |
| Incompatible high-molecular | HTR-860P-3 | 30 | 30 | 50 | 0 | 0 | 80 |
| weight component | HTR-860 | 0 | 0 | 0 | 40 | 0 | 0 |
| Cure accelerator | 2PN-CN | 0.5 | 0.5 | 0.5 | 0.5 | 0.5 | 0.5 |
| Silane coupling agent | NUC A-187 | 0.5 | 0.5 | 0.5 | 0.5 | 0.5 | 0.5 |
| Electric strength (kV) (before PCT) |  | 7.5 | 7.3 | 7.2 | 4.5 | 7.3 | 3.2 |
| Electric strength (kV) (after PCT) |  | 6.2 | 5.9 | 6.1 | 1.3 | 6.0 | 1.0 |
| Cracking resistance |  | Good | Good | Good | Good | Poor | Good |
| Flexibility |  | Good | Good | Good | Good | Poor | Good |
| The amount of exudation |  | Good | Good | Good | Good | Bad | Good |
| Circuit filling |  | Good | Good | Good | Good | Good | Poor |
| Tight adhesion (before PCT) |  | Good | Good | Good | Good | Good | Good |
| Tight adhesion (after PCT) |  | Good | Good | Good | Poor | Good | Good |
| Processability |  | Good | Good | Good | Good | Poor | Good |

HTR-860P-3: epoxy group-containing acrylic rubber
HTR-860: non-modified acrylic rubber All the adhesives of Examples 9–11 contained epoxy resins and a curing agent therefor and both of a high-molecular weight component compatible with the epoxy resins and a high-molecular weight component incompatible with the epoxy resins. They were excellent in electric strength and tight adhesion after the PCT treatment, and were as well excellent in cracking resistance, flexibility and processability. They are useful as adhesives for wiring boards because they were also excellent in the amount of exudation and circuit filling.

As compared with the adhesive of Comparative Example 7 containing a non-modified acrylic rubber as high- Denki Kagaku Kogyo Co., Ltd., trade name: FB-301) in a ratio of 80% by volume (100 parts by volume) of the adhesive and 20% by volume (25 parts by volume) of the silica powder, and an adhesive film was produced by using the mixture in the same manner as in Example 9.

Example 18

The adhesive prepared in Example 9 was mixed with sphere alumina powder (average particle size: 10 μm, produced by Showa Denko Co., Ltd., trade name: AS-50) in a ratio of 65% by volume (100 parts by volume) of the adhesive and 35% by volume (55 parts by volume) of the sphere alumina powder, and an adhesive film was produced by using the mixture in the same manner as in Example 9.

The adhesive films produced in Examples 13–16 and Comparative Examples 9–10 were examined for the flexibility and cracking resistance of cured products.

The electric strength between a copper foil and an aluminum plate was measured in the same manner as in Examples 9–12 and Comparative Examples 7–8. The results were the same as those of Examples 9–12 and Comparative Examples 7–8, respectively.

Adhesive-backed metal foils were produced in the same manner and under the same conditions as in Example 9, except that the adhesive varnishes prepared in Examples 9, Examples 13–18 and Comparative Examples 9–10 were used, and that a copper foil of 35 μm thick was used in place of the release-treated polyethyleneterephthalate film used in Example 9. Each adhesive-backed copper foil thus produced was cut off to 30 mm× 30 mm, superposed on an aluminum plate of 2 mm thick and 30 mm× 30 mm, with the adhesive side being in contact with the aluminum plate, and bonded by heating and pressing for 30 minutes at a temperature of 170° C. at a pressure of 1.96 MPa. The copper foil was then etched, leaving a central, rectangular portion of 10 mm× 14 mm not etched.

After a transistor (2SC2233) was soldered to the copper foil of the test piece, the test piece was placed on a heat dissipation block, with the aluminum plate being in contact with the dissipation plate, and an electric current was then applied to the transistor. The temperature (T1) of the transistor and the temperature (T2) of the heat dissipation block were measured, and the thermal resistance (X) was calculated from the measured values and the applied power (W) using the above-described equation. The results are shown in Table 4.

adhesive-backed metal foil of the present invention are as well excellent in circuit filling and tight adhesion.

We claim:

1. An adhesive produced by preparing a varnish of a composition dissolved in a solvent and heating the composition to dry, the composition comprising (1) 100 parts by weight of a combination of an epoxy resin having a weight average molecular weight of less than 5,000 and a curing agent, (2) 10 to 55 parts by weight of a compatible high-molecular weight component selected from the group consisting of a phenoxy resin, a carboxyl group-containing acrylic rubber, a carboxyl group-containing acrylonitrile-butadiene rubber, each having a weight average molecular weight of 30,000 or above, a high-molecular weight epoxy resin having a weight average molecular weight of 30,000 to 80,000 and an ultra high-molecular weight epoxy resin having a weight average molecular weight of more than 80,000, (3) 20 to 100 parts by weight of an incompatible high-molecular weight component having a weight average molecular weight of 30,000 or above and being selected from the group consisting of an epoxy group-containing acrylic rubber, an epoxy group-containing acrylonitrile-butadiene rubber, an epoxy group-containing polybutylene rubber and an epoxy group-containing polybutadiene, and (4) 0.1 to 5 parts by weight of a cure accelerator.

2. The adhesive of claim 1 which further contains 0.1 to 10 parts by weight of a coupling agent.

3. The adhesive of claim 2, wherein the coupling agent is a silane coupling agent.

4. The adhesive of claim 1 which further contains 0.5 to 10 parts by weight of an inorganic ion-adsorbent.

5. The adhesive of claim 4, wherein the inorganic ion-adsorbent is an antimony-bismuth compound.

6. The adhesive of claim 1 which is cured to such a degree that the adhesive has generated a heat of 10 to 40% of a total calorific value as measured by DSC which is generated when the adhesive is completely cured.

TABLE 4

|  | Example Nos. | | | | | | Comparative Example Nos. | | |
| --- | --- | --- | --- | --- | --- | --- | --- | --- | --- |
|  | 9 | 12 | 13 | 14 | 15 | 16 | 10 | 11 | 12 |
| Composition to which filler was added | Not added | Ex. 9[1] | Ex. 10[1] | Ex. 11[1] | Ex. 9[2] | Ex. 9[3] | Comp. Ex. 7[1] | Comp. Ex. 8[1] | Comp. Ex. 9[1] |
| Thermal resistance (° C./W) | 3.0 | 1.2 | 1.2 | 1.2 | 1.6 | 0.8 | 1.2 | 1.2 | 1.3 |

[1]filler 20% by volume: alumina powder (average particle size: 0.5 μm, AL-160SG-1)
[2]filler 20% by volume: silica powder (average particle size: 5–6 μm, FB-301)
[3]filler 35% by volume: sphere alumina powder (average particle size: 10 μm, AS-50)

Table 4 shows that the adhesives containing high efficiency heat dissipation fillers had decreased thermal resistance, indicating improved heat dissipation, and were also excellent in moisture resistance, heat resistance, cracking resistance, flexibility, circuit filling and tight adhesion.

Industrial Applicability

As described above, the adhesive, adhesive film and adhesive-backed metal foil of the present invention are so excellent in moisture resistance as to be deteriorated little by tests for moisture resistance under severe conditions, such as PCT treatment, and are also excellent in heat resistance, adhesion strength at high temperature, heat dissipation, reliability of insulation, cracking resistance and flexibility. Further, because of the proper flowability of the adhesive of the present invention, the adhesive, adhesive film and 7. The adhesive of claim 1 which further contains 13 to 38% by volume of an inorganic filler based on a volume of the adhesive.

8. The adhesive of claim 7, wherein the inorganic filler is alumina or silica.

9. The adhesive of claim 1, wherein the epoxy resin having a weight average molecular weight of less than 5,000 is selected from the group consisting of a bisphenol A liquid epoxy resin having a weight average molecular weight of 500 or less, a bisphenol F liquid epoxy resin having a weight average molecular weight of 500 or less, a phenol novolac epoxy resin and a cresol novolac epoxy resin, and the curing agent is selected from the group consisting of a phenol novolac resin, a bisphenol novolac resin and a cresol novolac resin, and the cure accelerator is a imidazole compound.

10. The adhesive of claim 1, wherein the incompatible high-molecular weight component is an epoxy group-containing acrylic rubber which is a copolymerization product of (a) 18 to 40% by weight of acrylonitrile, (b) 2 to 6% by weight of glycidyl acrylate or glycidyl methacrylate as a functional group-containing monomer and (c) 54 to 80% by weight of ethyl acrylate, ethyl methacrylate, butyl acrylate or butyl methacrylate and has a glass transition temperature of −10° C. or above and a weight average molecular weight of 800,000 or above.

11. The adhesive of claim 1, wherein the compatible high-molecular weight component is a phenoxy resin, and the incompatible high-molecular weight component is an epoxy group-containing acrylic rubber.

12. The adhesive of claim 10 which further contains 0.1 to 10 parts by weight of a coupling agent.

13. The adhesive of claim 12, wherein the coupling agent is a silane coupling agent.

14. The adhesive of claim 10 which further contains 0.5 to 10 parts by weight of an inorganic ion-adsorbent.

15. The adhesive of claim 14, wherein the inorganic ion-adsorbent is an antimony-bismuth compound.

16. The adhesive of claim 10 which is cured to such a degree that the adhesive has generated a heat of 10 to 40% of a total calorific value as measured by DSC which is generated when the adhesive is cured completely.

17. The adhesive of claim 10 which further contains 13 to 38% by volume of an inorganic filler based on a volume of the adhesive.

18. The adhesive of claim 17, wherein the inorganic filler is alumina or silica.

19. The adhesive of claim 10, wherein the epoxy resin having a weight average molecular weight of less than 5,000 is selected from the group consisting of a bisphenol A liquid epoxy resin having a weight average molecular weight of 500 or less, a bisphenol F liquid epoxy resin having a weight average molecular weight of 500 or less, a phenol novolac epoxy resin and a cresol novolac epoxy resin, the curing agent is selected from the group consisting of a phenol novolac resin, a bisphenol novolac resin and a cresol novolac resin, and the cure accelerator is an imidazole compound.

20. An adhesive film produced by forming a layer of the adhesive of any one of claims 1 to 8 and 9 to 19 on a base film.

21. An adhesive-backed metal foil produced by forming a layer of the adhesive of any one of claims 1 to 8 and 9 to 19 on a metal foil.

22. The adhesive of claim 1, wherein said compatible high-molecular weight component includes said phenoxy resin.

23. The adhesive of claim 22, wherein said incompatible high-molecular weight component includes said epoxy group-containing acrylic rubber.

24. The adhesive of claim 1, wherein said incompatible high-molecular weight component includes said epoxy group-containing acrylic rubber.

25. The adhesive of claim 1, wherein the curing agent is included in the adhesive in an amount such that the adhesive contains 0.8–1.2 moles of groups reactive with epoxy groups per mole of epoxy groups contained in the adhesive.

26. The adhesive of claim 1, wherein the compatible high-molecular weight component is included in the adhesive in an amount of 20–30 parts by weight per 100 parts by weight of the total of the epoxy resin and the curing agent.

* * * * *